(12) United States Patent
Glass et al.

(10) Patent No.: US 7,973,689 B2
(45) Date of Patent: Jul. 5, 2011

(54) BANDPASS MULTI-BIT SIGMA-DELTA ANALOG TO DIGITAL CONVERSION

(75) Inventors: Kevin William Glass, Scottsdale, AZ (US); Craig A. Hornbuckle, Torrance, CA (US); C. Gary Nilsson, Hawthorne, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 12/560,288

(22) Filed: Sep. 15, 2009

(65) Prior Publication Data

US 2010/0066578 A1    Mar. 18, 2010

Related U.S. Application Data

(60) Provisional application No. 61/097,444, filed on Sep. 16, 2008.

(51) Int. Cl.
*H03M 3/00* (2006.01)

(52) U.S. Cl. ........ 341/143; 341/118; 341/120; 341/144; 341/155

(58) Field of Classification Search .................. 341/143, 341/155, 120, 121, 43, 118, 144
See application file for complete search history.

(56) References Cited

U.S. PATENT DOCUMENTS

| | | | |
|---|---|---|---|
| 5,684,482 A | 11/1997 | Galton | |
| 6,020,836 A * | 2/2000 | Tlaskal | 341/143 |
| 6,061,010 A | 5/2000 | Adams et al. | |
| 6,396,428 B1 * | 5/2002 | Cheng | 341/143 |
| 6,414,615 B1 * | 7/2002 | Cheng | 341/143 |
| 6,697,004 B1 | 2/2004 | Galton et al. | |
| 6,816,100 B1 | 11/2004 | Galton et al. | |
| 6,836,228 B1 * | 12/2004 | Levinson et al. | 341/136 |
| 6,911,928 B2 * | 6/2005 | Orsier et al. | 341/143 |
| 7,002,499 B2 | 2/2006 | Kaplan | |
| 7,079,068 B2 * | 7/2006 | Clement et al. | 341/155 |
| 7,242,337 B2 * | 7/2007 | Uemori et al. | 341/143 |
| 7,298,306 B2 * | 11/2007 | Melanson | 341/143 |
| 7,432,840 B2 | 10/2008 | Doerrer et al. | |
| 7,629,912 B2 * | 12/2009 | Le Guillou et al. | 341/143 |
| 2004/0233081 A1 * | 11/2004 | Cesura et al. | 341/118 |
| 2006/0012499 A1 * | 1/2006 | Ihs et al. | 341/143 |
| 2007/0018867 A1 * | 1/2007 | Uemori et al. | 341/143 |
| 2008/0309536 A1 | 12/2008 | Le Guillou et al. | |

* cited by examiner

*Primary Examiner* — Linh V Nguyen

(74) *Attorney, Agent, or Firm* — McDermott Will & Emery LLP

(57) ABSTRACT

Examples of a system and method for sigma-delta analog-to-digital conversion of an electrical input signal are disclosed. A bandpass-filtered signal based on an electrical input signal and an analog feedback signal may be provided. A multi-bit digital representation of the bandpass-filtered signal may be provided. An analog representation of the multi-bit digital representation may be provided. A return-to-zero (RTZ) carving operation may be performed on the analog representation to obtain the analog feedback signal.

18 Claims, 5 Drawing Sheets

200
BANDPASS MULTI-BIT SIGMA-DELTA ANALOG TO DIGITAL CONVERSION

CROSS REFERENCE TO RELATED APPLICATIONS

The present application claims the benefit of priority under 35 U.S.C. §119 from U.S. Provisional Application Ser. No. 61/097,444, entitled "BANDPASS SIGMA-DELTA ANALOG-TO-DIGITAL CONVERTER," filed on Sep. 16, 2008, which is hereby incorporated by reference in its entirely for all purposes.

FIELD

The subject technology generally relates to analog-to-digital converters, and more particularly, relates to bandpass multi-bit sigma-delta analog-to-digital conversion system.

BACKGROUND

Radio systems have historically employed direct conversion and super-heterodyne analog architectures. These approaches require high quality local oscillators and precision mixers, and analog filters for selectivity. They are for the most part dedicated point solutions for a specific radio standard.

SUMMARY

In one aspect of the disclosure, a bandpass multi-bit sigma-delta analog-to-digital conversion (ADC) system may be provided for data conversion of an electrical input signal. The system can comprise a bandpass filter module configured to receive an electrical input signal and an analog feedback signal and to provide a bandpass-filtered signal. The system can comprise a multi-bit quantizer coupled to the bandpass filter module and configured to provide a multi-bit digital representation of the bandpass-filtered signal. The system can comprise a feedback digital-to-analog converter (DAC) module coupled to the multi-bit quantizer and configured to provide the analog feedback signal to the bandpass filter module. The feedback DAC module can comprise a digital-to-analog converter configured to provide an analog representation of the multi-bit digital representation. The feedback DAC module can comprise a return-to-zero carver circuit configured to select a portion of the analog representation within each sampling cycle.

In a further aspect of the disclosure, a method may be provided for performing a sigma-delta analog-to-digital conversion of an electrical input signal. The method can comprise providing a bandpass-filtered signal based on an electrical input signal and an analog feedback signal. The method can comprise providing a multi-bit digital representation of the bandpass-filtered signal. The method can comprise providing an analog representation of the multi-bit digital representation. The method can comprise performing a return-to-zero (RTZ) carving operation on the analog representation to obtain the analog feedback signal.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
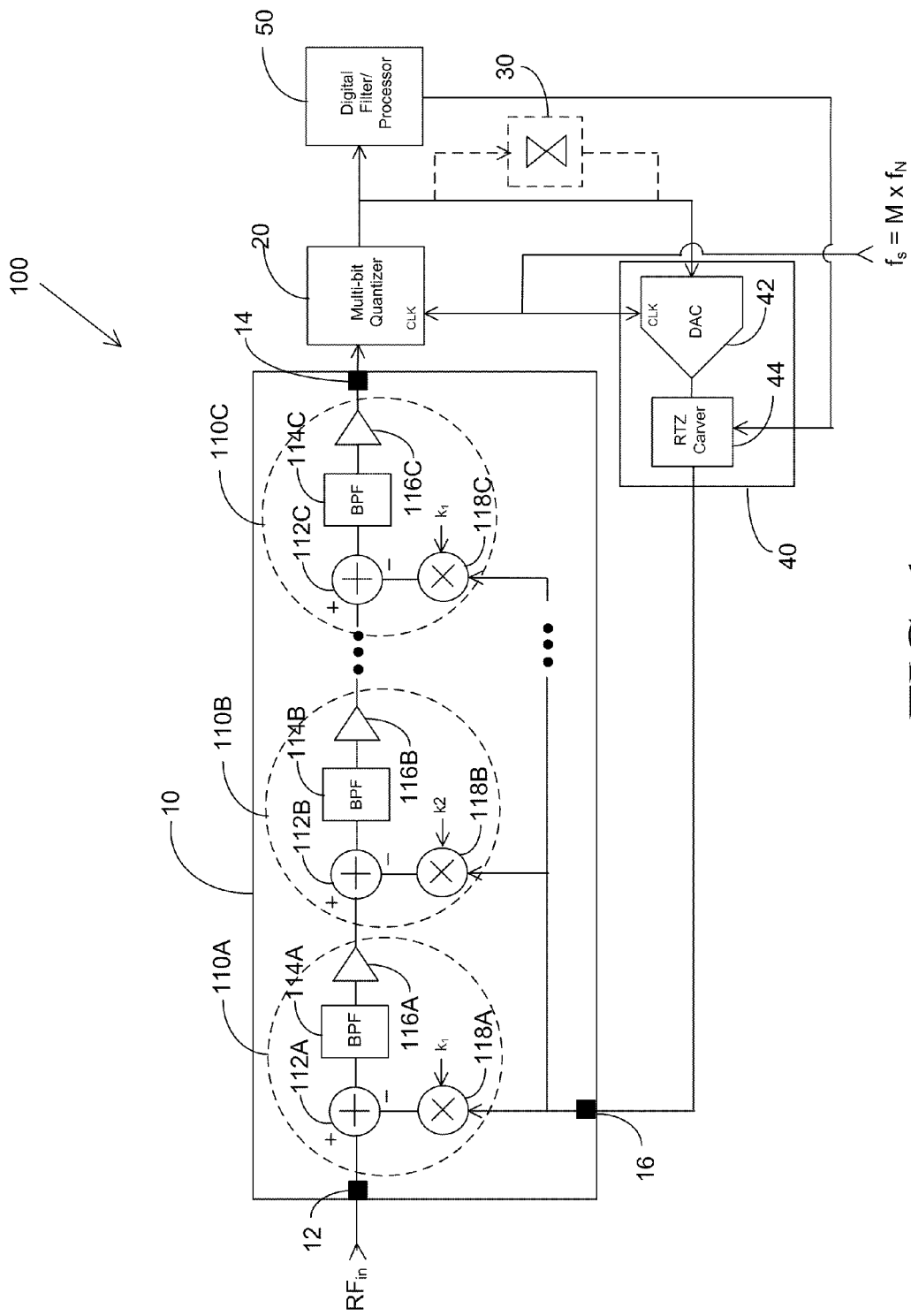
FIG. 1 is a schematic block diagram of an exemplary bandpass multi-bit sigma-delta conversion system according to one aspect of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Traditional radio systems have used high quality local oscillators and precision mixers, and analog filters for selectivity. These systems are generally for dedicated point solutions for a specific radio standard. Multi-mode operation can be problematic and can require totally separate and dedicated radio receivers. In one aspect, a "software defined radio" approach may be utilized, where a wideband analog to digital conversion is performed at radio frequency (RF), and digital signal processing (DSP) is used to perform the previously analog receiver functions. Multi-mode operation can be supported by changing the DSP program running on the same hardware. Defining the radio in software also allows "agile" operation—switching between standards on the fly. "Cognizant" operation—where the radio receives the transmitted spectrum, and decides what radio standard is being used and shifts to the appropriate software—is also enabled. In one aspect of the disclosure, a missing element necessary to implement a software-defined radio may be a high frequency, high dynamic range analog-to-digital converter.

Aspects of the subject technology relate to the implementation of software-defined radio. Configurations of the subject technology enable operation of a sigma-delta converter at a high enough frequency to support various technologies such as cellular phone, wireless networking, or radar. According to one example, a configuration of the subject technology is capable of operation at the full RF frequency without a front-end mixer.

By way of illustration and not limitation, in one aspect, a "sigma-delta analog-to-digital conversion" may refer to a type of analog-to-digital conversion scheme that oversamples a desired signal by a large factor and filters a desired signal band. Generally, a smaller number of bits than required may be converted using, for example, a quantizer (e.g., a Flash ADC) after a filter. The resulting signal, along with the error generated by the discrete levels of the quantizer, may be fed back and subtracted from the input to the filter. This negative feedback can have the effect of noise shaping the error due to the quantizer so that it does not appear in the desired signal frequencies. A digital filter (decimation filter) may follow the quantizer to reduce the sampling rate, filter off unwanted noise signal and increase the resolution of the output.

FIG. 1 is a schematic block diagram of an exemplary bandpass multi-bit sigma-delta conversion system 100 according to one aspect of the subject technology. The system 100 may include some or all of the following: a bandpass filter module 10, a multi-bit quantizer 20, an optional mismatch shaping circuit 30, a feedback digital-to-analog converter (DAC) module 40, and a digital filter and/or processor 50.

The bandpass filer module 10 may include an RF input 12, an output 14, and a feedback input 16. The bandpass filter module 10 may be configured to receive an RF input signal, e.g., from an antenna (not shown) and provide a bandpass-filtered signal at the output 14 based on the received RF input signal and an analog feedback signal received at the feedback input 16. The analog feedback signal will be described below with respect to the feedback DAC 40. In the illustrated example, the bandpass filter module 10 is a multi-pole bandpass filter module that includes a predetermined number (N) of filter stages 110A, 110B, 110C (corresponding to N poles). Each filter stage includes a subtractor (e.g., 112A, 112B or 112C), a bandpass filter (e.g., 114A, 114B or 114C), an amplifier (e.g., 116A, 116B or 116C), and a multiplier (e.g., 118A, 118B or 118C). In each filter stage, the corresponding bandpass filter 114A, 114B or 114C and the corresponding amplifier 116A, 116B, or 116C are characterized by a quality factor (Q) and a gain (G), respectively. In certain embodiments, the RF input signal has a carrier frequency in the range of 500 MHz to 5 GHz. In some examples, a bandpass filter may have lower and upper cutoff frequencies in accordance with or specified in various communication standards including, but not limited to, DCS, PCS, GSM, EDGE, IS95, CDMA, CDMA2000, WCDMA, LTE, 802.16, 802.11, and wideband frequency-hop or spread-spectrum radars. In some embodiments, a bandpass filter may be employed as part of a software-defined radio system that is configured to algorithmically select all or some of the above-mentioned communication standards. While the bandpass filter module 10 is described above with respect to an RF input signal, the bandpass filter module 10 can receive any electrical signal including, but not limited to, a cable signal, a fiber optic signal, a wireline (e.g., telephony) signal, and a radar signal.

The multi-bit quantizer 20 may be coupled to the bandpass filter module 10 and configured to receive the bandpass-filtered signal therefrom and to provide a multi-bit digital representation of the bandpass-filtered signal after the quantization. The multi-bit quantization can improve dynamic range for a given sampling frequency and bandwidth because it allows the input to get closer to the maximum range over which limit cycles or oscillations set in and also improve stability because it allows for a lower gain to be used. In addition, the multi-bit quantization also relaxes dynamic range requirement for the first filter stage on input, and reduces input overload margin.

The multi-bit quantization can be performed at a sampling frequency $f_s$ associated with a clock signal provided at a clock input of the quantizer 20. As applied to sigma-delta converters the sampling frequency $f_s$ is often expressed as $M \times f_N$, where M is the so-called "oversampling" factor and $f_N$ is Nyquist frequency, which is typically defined as twice the bandwidth of interest. In some embodiments, the bandpass multi-bit sigma-delta ADC system 100 includes a clock (not shown) for generating the clock signal. In other embodiments, the clock signal is provided by some other system clock or the processor 50.

The quantizer 20 can be implemented as a multi-bit analog-to-digital converter such as a flash ADC. In certain embodiments, the multi-bit quantizer is an L-bit ADC, where L is usually, but not limited to, an integer value such as 2, 3, 4, or 5. In other embodiments, additionally higher values of L having usually, but not limited to, additional ½ or 1 bit over a standard L-bits (e.g., 2, 3, 4, or 5 bits) may be used. The use of such an additional "over-bit" can further extend overload ranges by allowing the inputs to get closer to, be equal to, or, in some cases, to go over the maximum input value without setting off the limit cycles or oscillations. This concept of providing an over-bit for the purpose of overload range detection and correction may be extended to any multi-bit sigma-delta ADC systems including low-pass multi-bit signal-delta ADC systems.

The feedback DAC module 40 may be coupled to the multi-bit quantizer 20, either directly or indirectly via the optional mismatch shaping circuit 30, and is configured to receive the digital representation and to provide the analog feedback signal to the bandpass filter module 10 at the feedback input 16 as discussed above with respect to the bandpass filter module 10. In certain embodiments, the feedback DAC module 40 has the same number of bits (e.g., L bits) as the quantizer 20. In other embodiments, the number of bits can be different from the quantizer 20 and the feedback DAC module 40.

Because of circuit errors such as component mismatches (e.g., between the quantizer 20 and the feedback DAC module 40), data conversion by the feedback DAC module can introduce conversion noise. The conversion noise is not attenuated by the processing chain and can directly degrade the overall signal-to-noise-ratio (SNR) of the sigma-delta analog-to-digital conversion system 100. To the extent that the conversion noise consists of nonlinearities (e.g., harmonic distortion), the spurious-free dynamic range (SFDR) of the data converter is also reduced. In certain embodiments, an optional mismatch shaping circuit such as the mismatch shaping circuit 30 is provided between the quantizer 20 and the feedback DAC module 40 to reduce the conversion noise and nonlinearities. The mismatch shaping circuit 30 may randomly switch unitary bits of the quantizer 20 and the feedback DAC module 40 so as to randomize the conversion noise and nonlinearities. For example, the mismatch shaping circuit 30 may randomly or under an algorithmic control map unitary bits of the quantizer 20 to individual unitary DAC elements. This randomization results in noise-shaping, reduced conversion noise and/or improved linearity for the entire sigma-delta analog-to-digital converter system 100. The mismatching methodology and implementations thereof are described in detail in U.S. Pat. No. 5,684,482, which is incorporated herein by reference in its entirety, and are not repeated here for the sake of brevity.

In the illustrated example, the feedback DAC module 40 is a return-to-zero (RTZ) DAC that includes a DAC 42 and an RTZ carver circuit 44. The DAC 42 is configured to receive the multi-bit digital representation from the quantizer 20, either directly or via the mismatch shaping circuit 30, and to provide an analog representation of the multi-bit digital representation.

Figure 2:
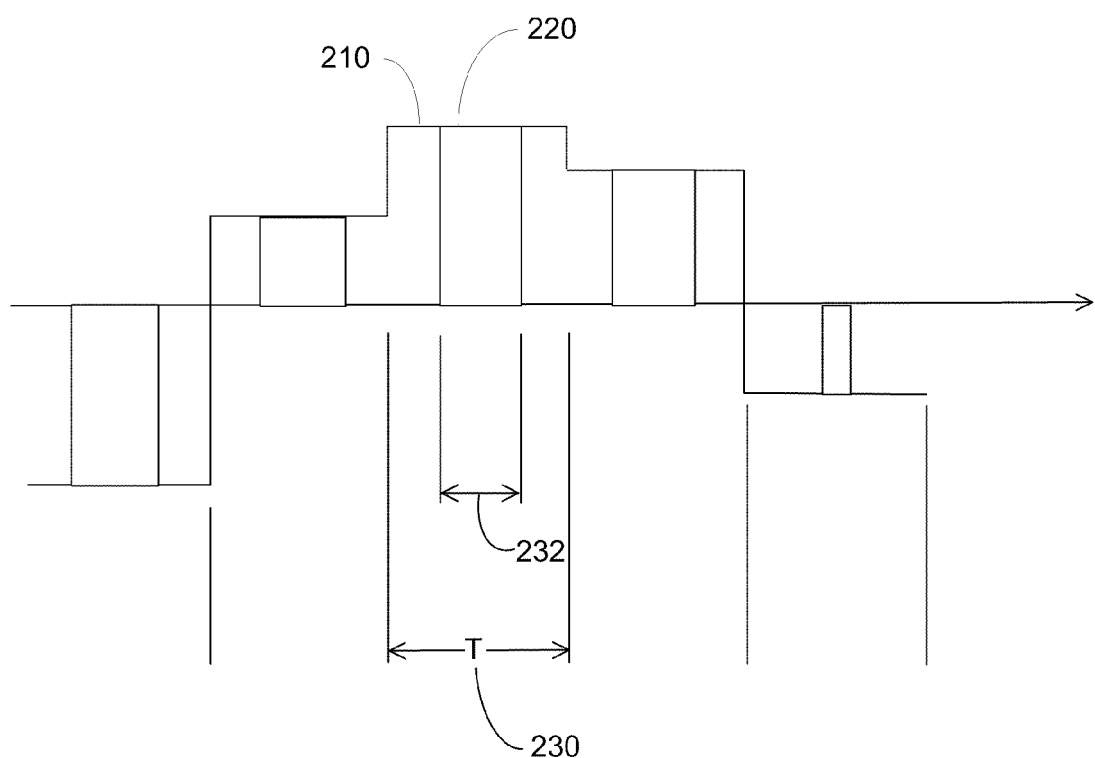
FIG. 2 is a graph illustrating a selection of a certain temporal portion of the analog representation within each sampling period by a return-to-zero (RTZ) carver circuit according to one aspect of the subject technology.

In one aspect, the RTZ carver circuit 44 may be configured to select a certain temporal portion 232 of the analog representation 210 within each sampling period 230 as illustrated in FIG. 2. (Here the sampling period 230 is an inverse of the sampling frequency discussed above, i.e., $T=1/f_s$.) Therefore, within each sampling period, the output 220 of the RTZ carver circuit 44 remains zero except during the selected temporal portion 232 where the output of the RTZ carver circuit 44 rises to a level corresponding to the output of the DAC 42 (e.g., the analog representation 210).

In one aspect, the use of such an RTZ carver circuit as part of the feedback DAC 40 is advantageous in that the circuit acts as a generator of a phase lead term that can compensate any phase lags introduced by one or more components of the sigma-delta analog-to-digital conversion system. The phase compensation can further improve the stability of the sigma-delta analog-to-digital conversion system. In certain embodiments, the selected temporal portion 232 (e.g., the position and/or the width) is adjustable to maximize the phase compensation and minimize the effect of any unknown phase lags introduced, for example, by the quantizer 20 and/or the feedback DAC module 40.

Figure 3:
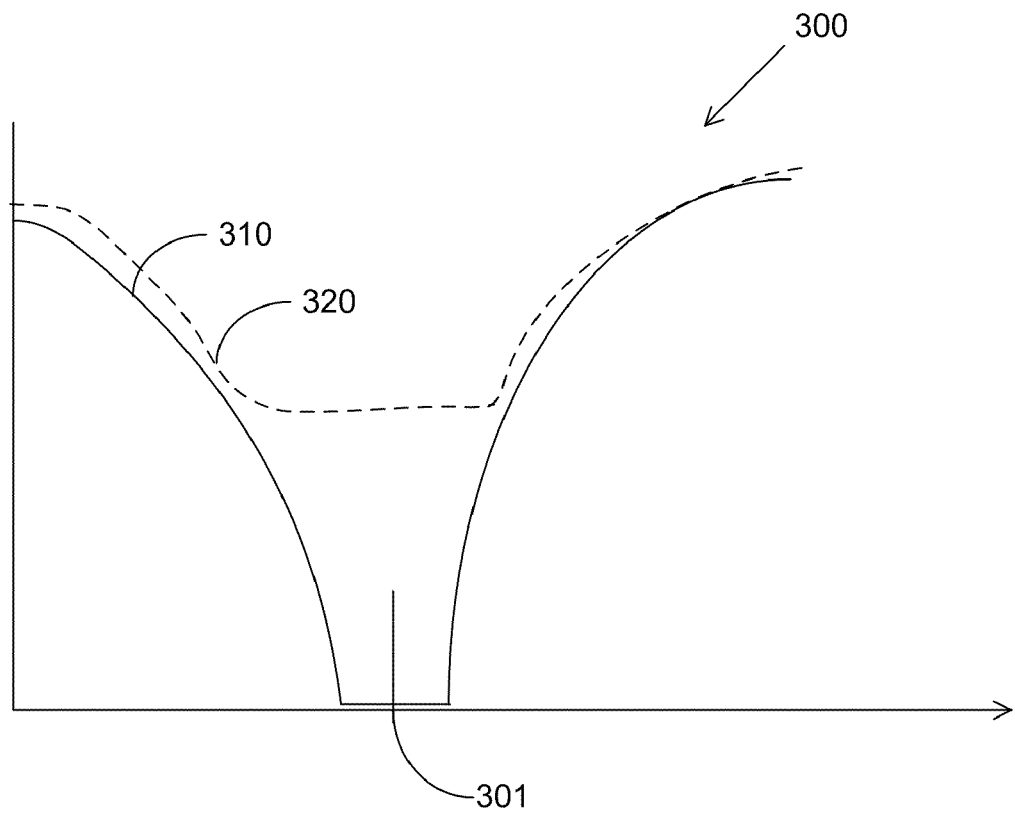
FIG. 3 is a graph illustrating an uncompensated noise-shaping spectrum and a fully compensated noise-shaping spectrum.

By way of example, FIG. 3 shows an uncompensated noise-shaping spectrum 320 and a fully compensated noise-shaping spectrum 310 obtained by adjusting the position (e.g., the beginning time) of the selected temporal portion, which is equivalent to adjusting the amount of the phase lead. In the illustrated example, the duty cycle for the selected portion 232 remains constant at about 50% throughout different sampling cycles, although, in alternative embodiments, the duty cycle can be varied from cycle to cycle. In the illustrated example of FIG. 1, the phase adjustment is achieved through a phase adjustment signal provided by a digital filter and/or signal processor 50. In certain embodiments, the phase adjustment is carried out programmatically until attenuation in the notch of the noise-shaping spectrum at a selected frequency 301 is maximized.

One problem with the utilization of multi-bit quantization is the extreme linearity required for the quantizer 20 and the feedback DAC module 40, and the matching required between them. To mitigate this problem, calibration of both elements is employed in accordance with one aspect of the subject technology. Calibration of the bandpass filter module 10 and the feedback filters 30 is also employed in accordance with another aspect of the subject technology. It shall be apparent to those skilled in the art that numerous calibration approaches and algorithms can be employed.

Returning to FIG. 1, the analog feedback signal provided by the feedback DAC module 40 is fed into the feedback input 16 of the bandpass filter module 10. The analog feedback signal is split and fed into inputs of multipliers 118A, 118B, 118C associated with different filter stages 110A, 110B, 110C. Within each filter stage, the analog feedback signal is multiplied by a different multiplication factor (e.g., $k_1$, $k_2$, $k_3$). The outputs of the multipliers 118A, 118B, 118C are in turn fed into inputs of the subtractors 112A, 112B, 112C. In the first filter stage 110A, the output of the multiplier 118A is subtracted from the RF input signal by the subtractor 112A to provide a first residue signal that is in turn fed into the bandpass filter 114A. In the second filter stage 110B, the output of the multiplier 118B is subtracted from the output of the first filter stage 110A by the second subtractor 112B to provide a second residue signal that is in turn fed into the bandpass filter 114B. In the last $(N^{th})$ filter stage 110C, the output of the multiplier 118C is subtracted from the output of a previous $(N-1)^{th}$ filter stage by the subtractor 112C to provide an $N^{th}$ residue signal that is in turn fed into the bandpass filter 114C.

It shall be appreciated by those skilled in the art that many different ways of implementing a bandpass filter are known in the art and that the particular bandpass filter module 10 shown in FIG. 1 is provided for illustration purpose only. Any type of bandpass filters including, but not limited to, active filters of various topologies, $G_mCL$, $G_mC$, passive, and the like may be used.

The number of poles (N) associated with the bandpass filter module 10 and the number of quantization bits (L) associated with the quantizer 20 are some of design parameters that can be determined at the design stage based on desired performance characteristics such as desired noise-shaping spectrum.

Figure 4:
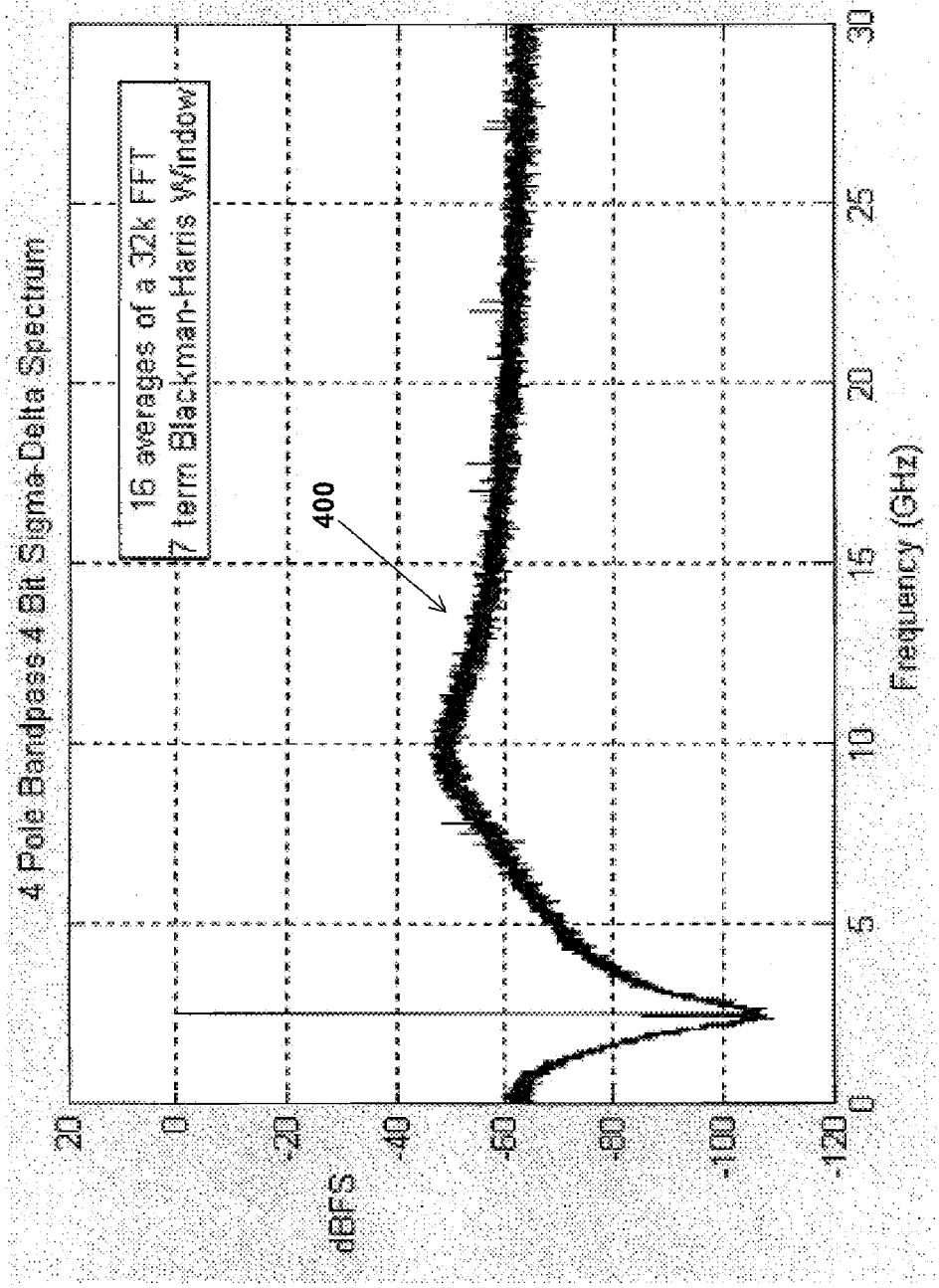
FIG. 4 is a graph showing an exemplary noise-shaping spectrum obtained from a 4 pole 4 bit (N=4; L=4) sigma-delta conversion system.

FIG. 4 shows an exemplary noise-shaping spectrum 400 that is obtained from a 4 pole 4 bit (N=4; L=4) sigma-delta conversion system. In the illustrated example, the noise-shaping spectrum 400 has a maximum attenuation at a selected peak noise rejection frequency of about 2.5 GHz.

Returning to FIG. 1, the multi-bit digital representation of the bandpass-filtered signal provided by the multi-bit quantizer 20 may be also fed into the digital filter and/or processor 50 for further processing. For example, in a software-defined radio system, certain digital processing functions such as digital filtering, demodulation and decoding can be performed by the digital filter and/or processor 50 to extract information from the digitized RF signal. In certain embodiments, at least some of the digital processing functions can be performed by a digital signal processor (DSP) executing a software program stored in a memory. In some of such embodiments, some of the digital processing functions (e.g., digital filtering) are performed by a dedicated logic circuit while other digital processing functions (e.g., decoding) are performed programmatically by the DSP. Alternatively, all of the digital processing functions can be performed programmatically by the DSP or implemented in a field programmable gate array (FPGA).

Figure 5:
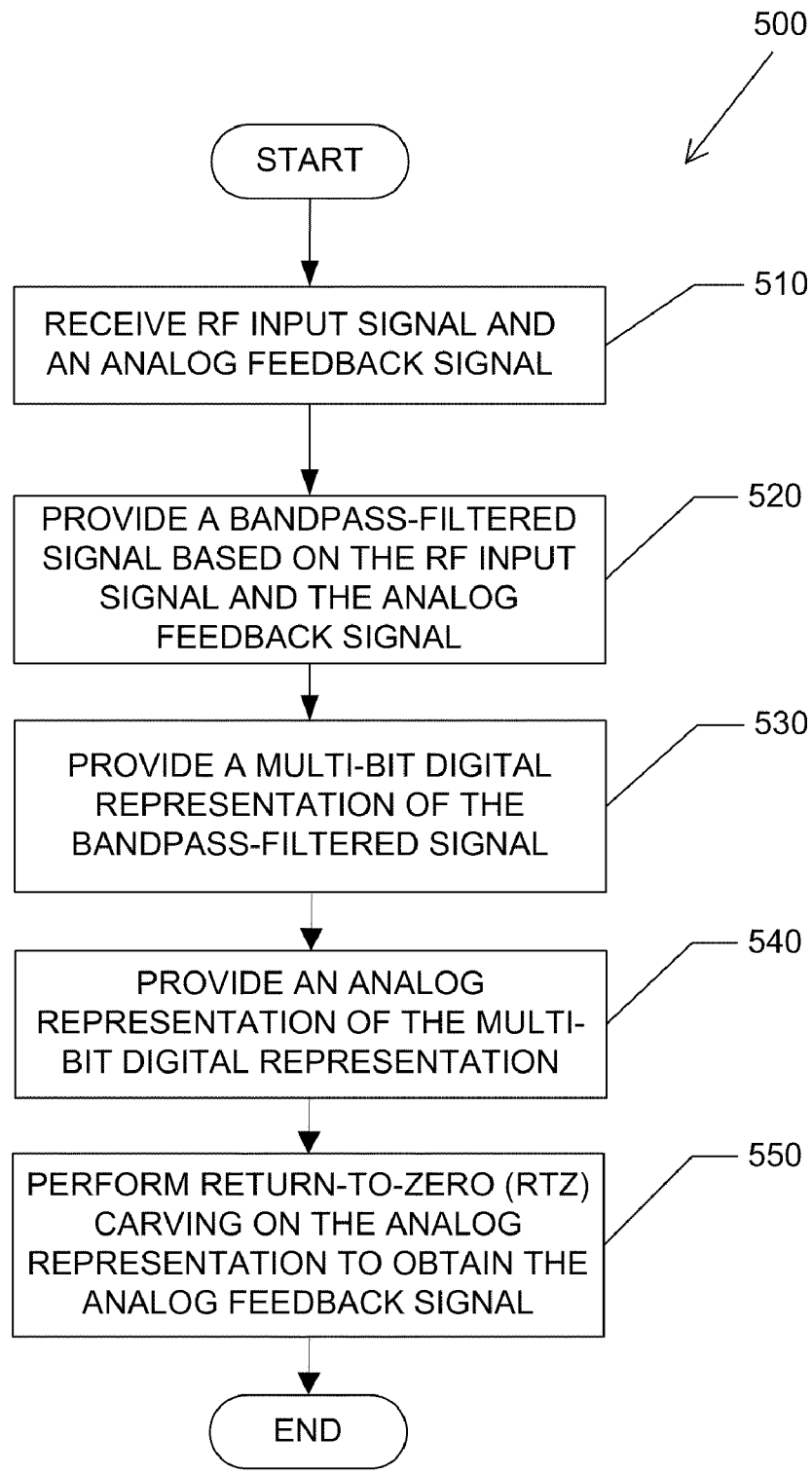
FIG. 5 is a flowchart illustrating an exemplary process for performing a sigma-delta analog-to-digital conversion of a radio frequency (RF) input signal according to one aspect of the subject technology.

FIG. 5 is a flowchart illustrating an exemplary process 500 for performing a sigma-delta analog-to-digital conversion of a radio frequency (RF) input signal according to one aspect of the subject technology. For ease of illustration, various operations of the process 500 will be described with respect to the exemplary bandpass multi-bit sigma-delta analog-to-digital conversion system 100 of FIG. 1. However, it shall be appreciated by those skilled in the art that the process 500 or a variation thereof can be implemented in a different configuration of bandpass multi-bit sigma-delta analog-to-digital conversion system without departing from the scope of the present disclosure. The process 500 begins at start state and proceeds to a state 510, in which an RF input signal to be digitized and an analog feedback signal are received, e.g., by the bandpass filter module 10. The process 500 proceeds to a state 520, in which a bandpass-filtered signal that is generated based on the RF input signal and the analog feedback signal is provided, e.g., by the bandpass filter module 10.

The process 500 proceeds to a state 530, in which a multi-bit digital representation of the bandpass filtered signal is provided, e.g., by the quantizer 20. The process 500 proceeds to a state 540, in which an analog representation of the multi-bit digital representation is provided, e.g., by the DAC 42. The process 500 proceeds to a state 550, in which a return-to-zero carving operation is performed on the analog representation, e.g., by the RTZ carver circuit 42, to obtain the analog feedback signal. As explained above, the analog feedback signal is used e.g., by the bandpass-filter module 10 in conjunction with the RF input signal to provide the bandpass-filtered signal.

Although not shown in FIG. 5, additional digital processing operations (e.g., filtering, demodulation, and decoding) may be performed on the multi-bit digital representation to extract information carried by the RF input signal as part of providing, for example, a software-defined radio system.

The subject technology has been described with particular illustrative configurations. It is to be understood that the subject technology is not limited to the above-described configurations and that various changes and modifications may be made by those of ordinary skill in the art without departing from the scope of the subject technology.

Those of skill in the art would appreciate that the various illustrative blocks, modules, elements, components, methods, and algorithms described herein may be implemented as electronic hardware, computer software, or combinations of both. For example, the digital filter and/or processor 50 may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology. For example, the bandpass multi-bit sigma-delta analog-to-digital conversion system can utilize a different type or configuration of bandpass filter(s) than what is shown by the bandpass filter module of FIG. 1. Although the conversion system shown in FIG. 1 employs a single feedback DAC module, a plurality of feedback DAC modules, one for each filter stage, may be employed instead, in which case the separate multipliers 118A, 118B, 118C may not be necessary. In one aspect, the term ADC may refer to analog-to-digital conversion, analog-to-digital converter or the like, and term DAC may refer to digital-to-analog conversion, digital-to-analog converter or the like.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

The invention claimed is:

1. A bandpass multi-bit sigma-delta analog-to-digital conversion system for data conversion of an electrical input signal, the system comprising:
    a bandpass filter module configured to receive an electrical input signal and an analog feedback signal and to provide a bandpass-filtered signal;
    a multi-bit quantizer coupled to the bandpass filter module and configured to provide a multi-bit digital representation of the bandpass-filtered signal; and
    a feedback digital-to-analog converter (DAC) module coupled to the multi-bit quantizer and configured to provide the analog feedback signal to the bandpass filter module, the feedback DAC module comprising:
        a digital-to-analog converter configured to provide an analog representation of the multi-bit digital representation, and
        a return-to-zero carver circuit configured to select a portion of the analog representation within each sampling cycle.

2. The system of claim 1, wherein the electrical input signal is a radio-frequency (RF) signal having a carrier frequency in the range of 500 MHz to 5 GHz.

3. The system of claim 1, wherein the bandpass filter module comprises a plurality of filter stages.

4. The system of claim 3, wherein the bandpass filter module comprises more than three filter stages.

5. The system of claim 3, wherein each of the plurality of filter stages comprises a bandpass filter and an amplifier.

6. The system of claim 5, wherein each of the plurality of filter stages is characterized by a quality factor associated with the bandpass filter and a gain associated with the amplifier.

7. The system of claim 1, wherein the bandpass filter module is configured to provide a maximum noise attenuation at a selected noise-rejection frequency.

8. The system of claim 7, wherein the selected noise-rejection frequency is greater than 1 GHz.

9. The system of claim 1, wherein the multi-bit quantizer is configured to quantize the bandpass-filtered signal at an L-bit resolution, wherein L is a value greater than 1.

10. The system of claim 9, wherein L is a fractional value greater than 1.

11. The system of claim 1, wherein the multi-bit quantizer comprises a flash analog-to-digital converter.

12. The system of claim 1, wherein the multi-bit quantizer is configured to provide the digital representation at a rate given by $f_s = M \times f_N$, wherein M is an oversampling factor and $f_N$ is Nyquist frequency.

13. The system of claim 1, wherein the portion of the analog representation selected by the return-to-zero carver circuit is adjustable.

14. The system of claim 1, wherein the feedback DAC module is coupled to the multi-bit quantizer via a mismatch shaping circuit configured to switch bits of the multi-bit quantizer.

15. A software-defined radio system comprising the system of claim 1.

16. The software-defined radio system of claim 15, further comprising a digital signal processor configured to process the digital representation of the bandpass-filtered signal according to a selected communication standard.

17. A method of performing a sigma-delta analog-to-digital conversion of an electrical input signal, the method comprising:
providing a bandpass-filtered signal based on an electrical input signal and an analog feedback signal;
providing a multi-bit digital representation of the bandpass-filtered signal;
providing an analog representation of the multi-bit digital representation; and
performing a return-to-zero (RTZ) carving operation on the analog representation to obtain the analog feedback signal, the carving operation including selecting a portion of the analog representation.

18. The method of claim 17, wherein performing the RTZ carving operation comprises outputting an analog signal corresponding to the analog representation during a selected time portion within a sampling period and returning to zero at other times.

* * * * *